United States Patent
Yamaguchi (10) Patent No.: US 8,121,307 B2
(45) Date of Patent: Feb. 21, 2012

(54) IN-VEHICLE SOUND CONTROL SYSTEM

(75) Inventor: Katsuhiro Yamaguchi, Osaka (JP)

(73) Assignee: Panasonic Corporation, Osaka (JP)

( * ) Notice: Subject to any disclaimer, the term of this patent is extended or adjusted under 35 U.S.C. 154(b) by 770 days.

(21) Appl. No.: 11/573,316

(22) PCT Filed: Jun. 22, 2006

(86) PCT No.: PCT/JP2006/312479
§ 371 (c)(1),
(2), (4) Date: Feb. 6, 2007

(87) PCT Pub. No.: WO2007/007523
PCT Pub. Date: Jan. 18, 2007

(65) Prior Publication Data
US 2010/0040242 A1 Feb. 18, 2010

(30) Foreign Application Priority Data
Jul. 7, 2005 (JP) .................................. 2005-198308

(51) Int. Cl.
*H04B 1/00* (2006.01)
*A61F 11/06* (2006.01)
*G10K 11/16* (2006.01)
*H03B 29/00* (2006.01)
*H03G 3/00* (2006.01)

(52) U.S. Cl. .......................... 381/86; 381/71.4; 381/104

(58) Field of Classification Search .................... 381/86, 381/71.4, 104
See application file for complete search history.

(56) References Cited

U.S. PATENT DOCUMENTS

| | | | |
|---|---|---|---|
| 4,677,677 A * | 6/1987 | Eriksson | 381/71.11 |
| 5,325,437 A * | 6/1994 | Doi et al. | 381/71.9 |
| 5,377,274 A * | 12/1994 | Meyer et al. | 381/59 |
| 5,485,523 A * | 1/1996 | Tamamura et al. | 381/71.4 |
| 5,677,960 A * | 10/1997 | Unno et al. | 381/86 |
| 6,859,539 B1 * | 2/2005 | Maeda | 381/86 |
| 7,058,183 B2 * | 6/2006 | Hasegawa et al. | 381/86 |

(Continued)

FOREIGN PATENT DOCUMENTS
EP    1 253 806 A    10/2002
(Continued)

OTHER PUBLICATIONS

International Search Report for Application PCT/JP2006/312479, dated Sep. 26, 2006.

(Continued)

*Primary Examiner* — Hai Phan
(74) *Attorney, Agent, or Firm* — RatnerPrestia (57) ABSTRACT

An in-vehicle sound control system structured so that sound sources, a vehicle speed detection unit for detecting a vehicle running speed, and an acoustic reproduction apparatus are connected to in-vehicle communications network. The in-vehicle sound control system controls, in accordance with a vehicle speed signal transmitted from the vehicle speed detection unit, a reproduction acoustic signal. The acoustic reproduction apparatus switches, in accordance with a plurality of inputted sound sources and media information of a sound source, a control amount to sound control section determined based on a vehicle speed signal. In this manner, such an in-vehicle sound control system is provided that can provide an optimal automatic sound control for human ears even when the medium is exchanged or when a channel for a sound source in the medium is switched to another channel.

4 Claims, 6 Drawing Sheets

U.S. PATENT DOCUMENTS

| | | | |
|---|---|---|---|
| 7,171,006 B2 * | 1/2007 | Kimura | 381/86 |
| 7,466,828 B2 * | 12/2008 | Ito | 381/86 |
| 7,574,006 B2 * | 8/2009 | Funayama et al. | 381/71.12 |
| 7,583,807 B2 * | 9/2009 | Enomoto et al. | 381/86 |
| 2003/0059067 A1 * | 3/2003 | Shibata | 381/119 |
| 2004/0240678 A1 * | 12/2004 | Nakamura et al. | 381/71.11 |

FOREIGN PATENT DOCUMENTS

| | | |
|---|---|---|
| EP | 1 530 400 A | 5/2005 |
| JP | 02-114708 | 4/1990 |
| JP | 2000-022470 | 1/2000 |
| JP | 2001-250333 | 9/2001 |
| JP | 3352946 | 9/2002 |
| JP | 2005-129221 | 5/2005 |

OTHER PUBLICATIONS

Supplementary European Search Report for Application No. EP 06 76 7137 dated Sep. 18, 2008.

* cited by examiner

IN-VEHICLE SOUND CONTROL SYSTEM

This application is a U.S. National Phase Application of PCT International Application PCT/JP2006/312479.

TECHNICAL FIELD

The present invention relates to an in-vehicle sound control system that senses a vehicle speed or noise in a vehicle interior to automatically adjust a value of an acoustic characteristic such as volume.

BACKGROUND ART

Conventionally, an example of a system for performing an automatic volume control depending on a level of noise in a vehicle has been disclosed by Japanese Patent No. 3352946. This system has an adaptive sound quality/volume control apparatus that provides an effect of controlling a sound quality and a volume in a manner natural to human ears by automatically controlling the volume, during the switching between sound sources as an input source, via a switch for changing a correction value for volume control.

Figure 6:
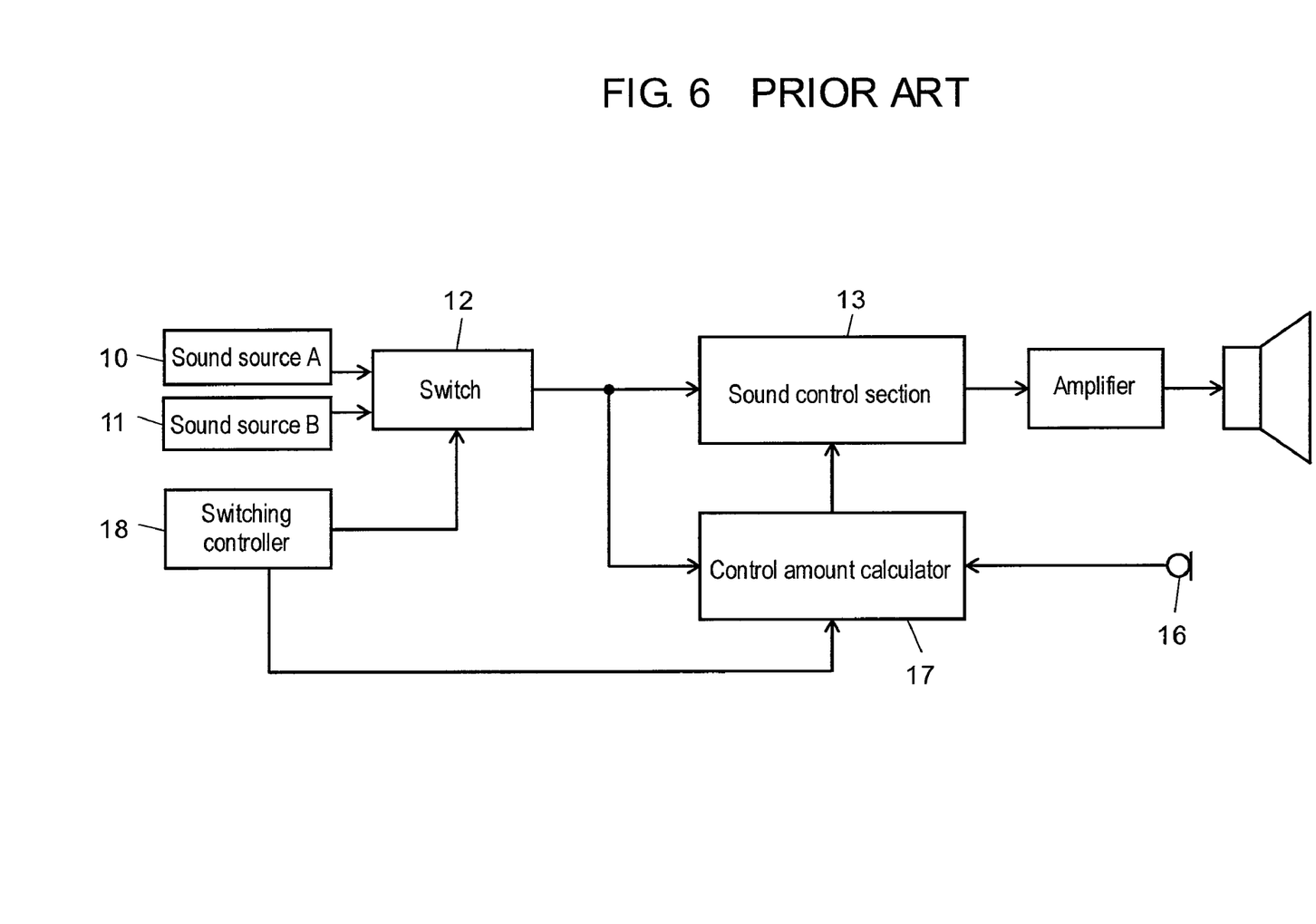
FIG. 6 illustrates an example of a circuit block of a conventional in-vehicle sound control system.

For example, a system shown in FIG. 6 will be exemplarily described. In FIG. 6, switch 12 is designed to allow, while a sound source signal is being outputted from sound source A 10 in FIG. 6, sound from sound source A 10 to be inputted to the system. In this status, a microphone signal collected by microphone 16 and a sound source signal from sound source A 10 are inputted to control amount calculator 17. Then, sound control section 13 is controlled based on a control amount previously determined for sound source A 10 based on an assumed noise level. When sound source B 11 is selected in this status, switching controller 18 controls control amount calculator 17 and switch 12. Based on a control amount previously determined for sound source B 11, control amount calculator 17 controls sound control section 13 and switch 12 allows an input from sound source B 11 to enter the system. By the control as described above, control amounts to sound source A 10 and sound source B 11 are always calculated and a switching between the control amounts is performed when a switching between the sound source signals is performed. Thus, a sound quality and a volume can be adjusted by an optimal control amount even when the signal level of the sound source suddenly increases or decreases due to the switching between sound source signals, thus providing a sound control in a manner natural to human ears. As described above, the conventional adaptive sound quality volume control apparatus has provided an automatic sound control in response to the switching between sound sources as an input source.

However, with the recent advent of multichannel and multimedia such as multichannel audio (e.g., Digital Versatile Disc (DVD)), different sound source signals may be inputted to the system from even a single sound source. This has caused, when a sound source is a DVD and a DVD linear pulse code modulation (PCM) signal or a DVD 5.1 ch (channel) signal is reproduced, a situation where the automatic sound control suppresses, if the control method is not changed, a dialog sound outputted from a center channel by the reproduction of a DVD 5.1 ch signal for example from being caught by human ears despite the intention or causes an unnatural control to human ears.

SUMMARY OF THE INVENTION

The in-vehicle sound control system of the present invention is structured so that a plurality of sound sources, a vehicle speed detection unit for detecting a vehicle running speed, and an acoustic reproduction apparatus are connected to an in-vehicle communications network, the acoustic reproduction apparatus is connected to a plurality of speakers, and the system controls a reproduction acoustic signal in accordance with a vehicle speed signal transmitted from the vehicle speed detection unit, wherein, the acoustic reproduction apparatus includes: a sound source signal distribution section for distributing sound source signals inputted from the plurality of sound sources to a plurality of predetermined channels; a sound control section for adjusting frequency characteristics and volumes of the sound source signals distributed to the plurality of channels; and a microcontroller for controlling the sound source signal distribution section and the sound control section. In accordance with inputted the plurality of sound sources and media information of the plurality of sound sources, a control amount to the sound control section determined based on the vehicle speed signal is switched and reproduction signals for the respective plurality of channels outputted via the sound control section are inputted to the plurality of speakers, respectively.

The in-vehicle sound control system of the present invention is structured so that a plurality of sound sources, a vehicle speed detection unit for detecting a vehicle running speed, and an acoustic reproduction apparatus are connected to an in-vehicle communications network, the acoustic reproduction apparatus is connected to a plurality of speakers and at least one microphone, and the system controls a reproduction acoustic signal in accordance with a vehicle speed signal transmitted from the vehicle speed detection unit or a noise level detected by the microphone, wherein, the acoustic reproduction apparatus includes: a sound source signal distribution section for distributing the sound source signals inputted from a plurality of sound sources to a plurality of predetermined channels; a sound control section for adjusting frequency characteristics and volumes of the sound source signals distributed to the plurality of channels; a reproduction signal analysis/selection section for extracting reproduction signals for a plurality of respective channels outputted through the sound control section by a predetermined method; a microphone signal analysis/extraction section for extracting a signal inputted from the microphone by a predetermined method; a signal level comparator for comparing a level of an signal outputted from the reproduction signal analysis/selection section with that from the microphone signal analysis/extraction section; and a microcontroller for controlling the sound source signal distribution section, the sound control section, the reproduction signal analysis/selection section, and the microphone signal analysis/extraction section. In accordance with the inputted plurality of sound sources and media information of the sound sources, a reproduction signal for a channel selected by the reproduction signal analysis/selection section is switched to a microphone signal extracted by the microphone signal analysis/extraction section and a control amount to the sound control section determined based on the vehicle speed signal or the noise level extracted by the microphone is switched, and reproduction signals for the respective plurality of channels outputted through the sound control section are inputted to the plurality of speakers, respectively. By doing this, a noise signal detection method can be changed depending on the type of a medium or a reproduction channel and a control method to a sound control section can be switched to an optimal method based on a vehicle speed signal or a noise level extracted from a microphone.

REFERENCE MARKS IN THE DRAWINGS 100, 400 In-vehicle communications network
101, 401 DVD deck
102, 402 Head unit
103, 403 Navigation unit
104, 404 Sound source signal input section
105, 405 Sound source signal distribution section
106, 406 Sound control section
107, 407 A/D converter
108, 408 D/A converter
109, 409 Amplifier
110, 410 Speaker
111, 411 Microcontroller
112, 412 Communications interface section (communications I/F section)
113, 413 Vehicle speed detection unit
120, 420 Acoustic reproduction apparatus
414 Reproduction signal analysis/selection section
415 Signal level comparator
416 Microphone signal analysis/extraction section
417 Microphone

DETAILED DESCRIPTION OF PREFERRED EMBODIMENTS

Hereinafter, embodiments of the present invention will be described with reference to the drawings.

Embodiment 1

Figure 1:
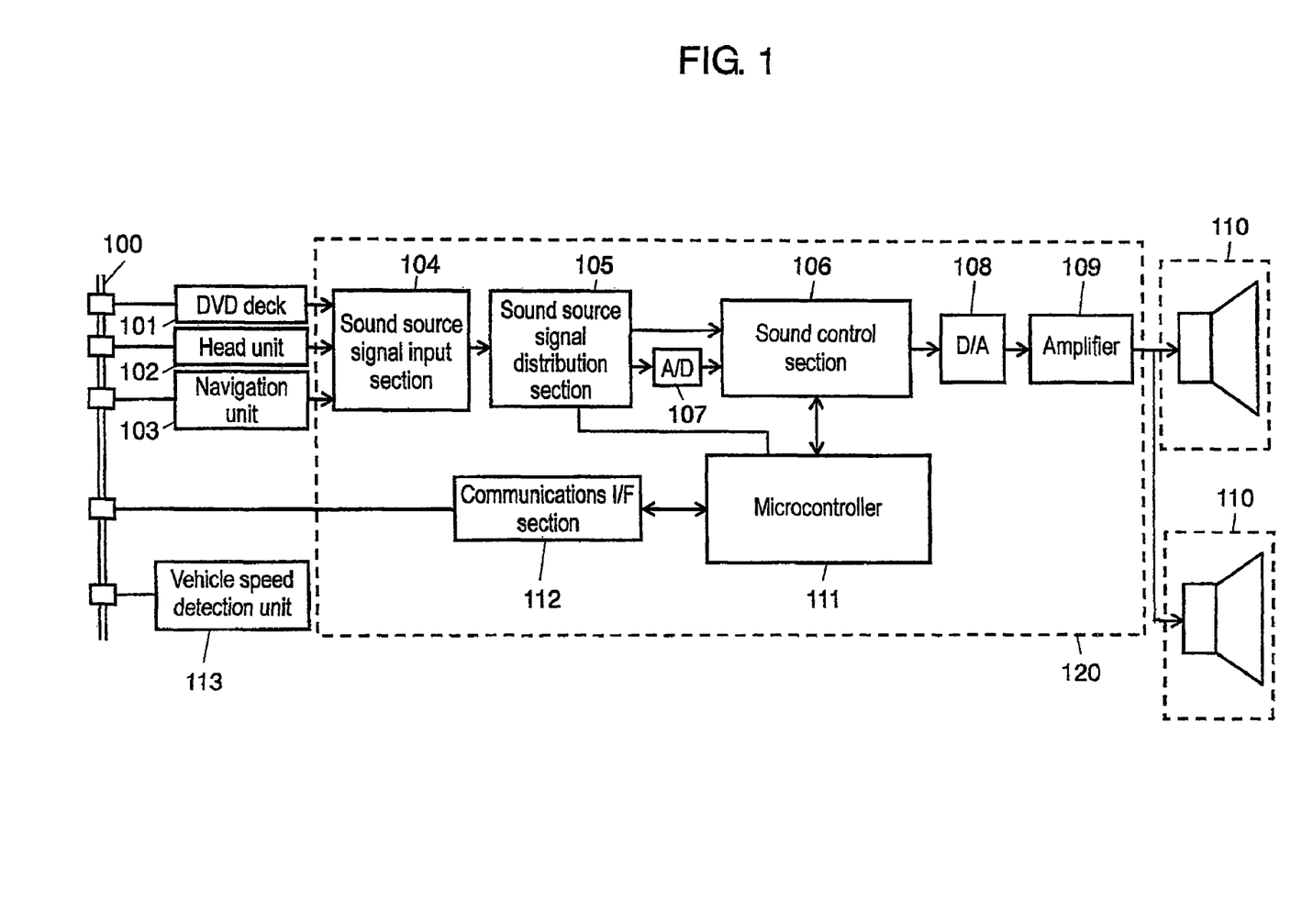
FIG. 1 illustrates an example of a circuit block of an in-vehicle sound control system in Embodiment 1 of the present invention.

FIG. 1 illustrates an example of a circuit block of an in-vehicle sound control system in Embodiment 1 of the present invention.

As shown in FIG. 1, in-vehicle communications network 100 is connected with: DVD deck 101 as the first sound source; head unit 102 as the second sound source; navigation unit 103 as the third sound source; vehicle speed detection unit 113; and acoustic reproduction apparatus 120. Acoustic reproduction apparatus 120 includes sound source signal input section 104 to which a sound source is inputted. An input side of sound source signal input section 104 is connected with output sides of DVD deck 101 as a sound source, head unit 102, and navigation unit 103. Acoustic reproduction apparatus 120 is structured so that a sound source inputted from sound source signal input section 104 is distributed by sound source signal distribution section 105 to a predetermined channel and the sound source is directly inputted to sound control section 106 composed of DSP or the like or is inputted via Analog to Digital Converter (A/D converter, shown as "A/D" in the drawing) 107. Reproduction signals having predetermined volume or frequency characteristics controlled by sound control section 106 are inputted, via a Digital to Analog Converter ((D/A converter), shown as "D/A" in the drawing) 108, to amplifier 109 and the respective reproduction channels are outputted from speakers 110 provided for the respective reproduction channels. Microcontroller 111 receives, via communications interface section (hereinafter simply referred to as communications I/F section) 112, a vehicle speed signal transmitted from vehicle speed detection unit 113 or a control signal transmitted from sound sources 101, 102, and 103, thereby controlling sound control section 106 and sound source signal distribution section 105.

Next, a specific operation of this in-vehicle sound control system will be described with reference to FIG. 2 and FIG. 3.

Figure 2:
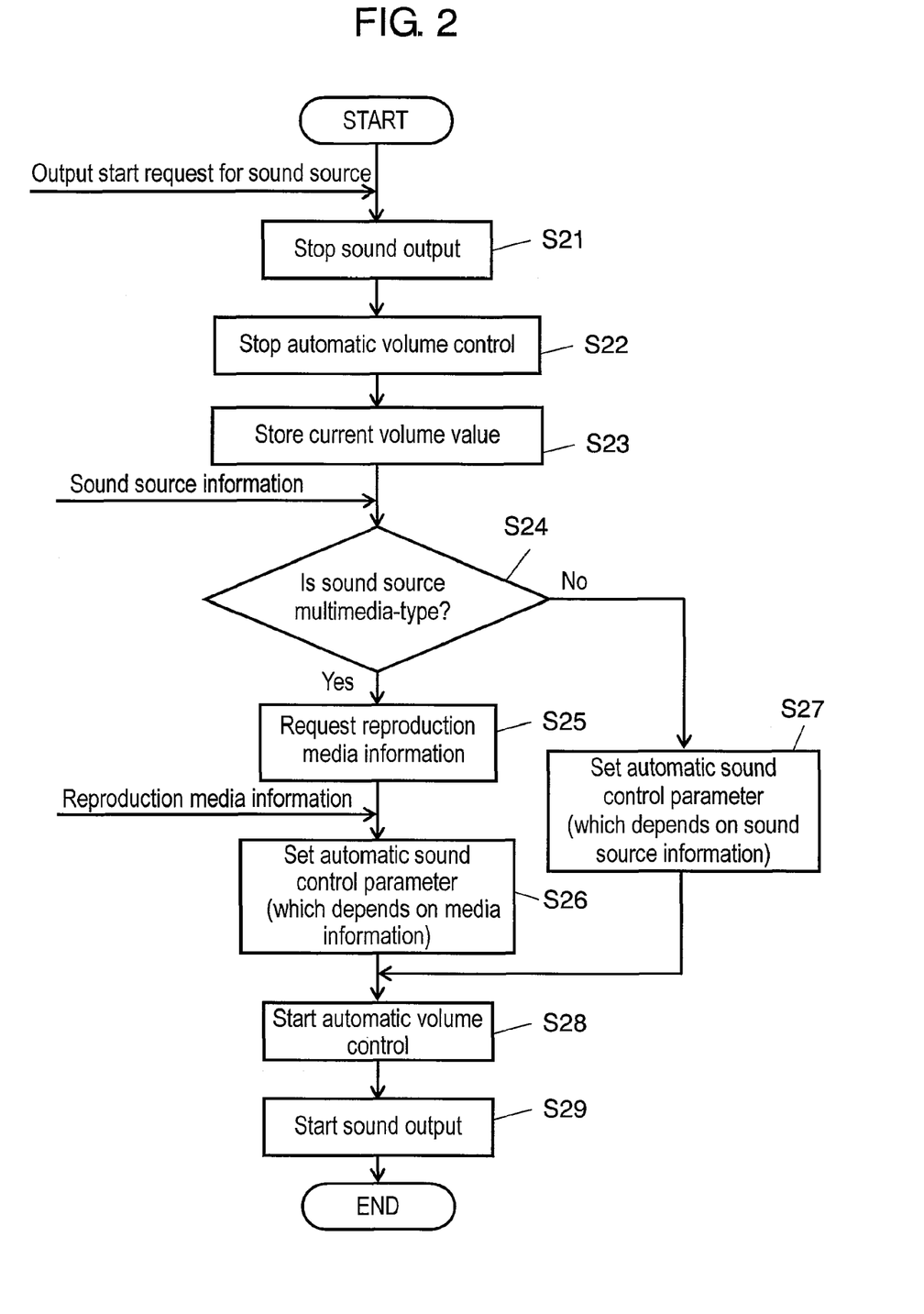
FIG. 2 is a flow diagram of processing performed by a microcontroller when, while a sound source is being reproduced by the acoustic reproduction apparatus in Embodiment 1, the sound source is switched to another sound source.

FIG. 2 is a flow diagram of processing performed by microcontroller 111 when, while a certain sound source is being reproduced by acoustic reproduction apparatus 120, the sound source is switched to another sound source or a medium in the sound source is exchanged to another medium.

Upon receiving a control signal representing an output start request (change request) for the sound source, microcontroller 111 stops a sound output (S21) and stops an automatic volume control (S22). Then, microcontroller 111 stores a current volume value (S23) and receives sound source information from the sound source to determine whether the sound source is the multimedia type one or not (S24). The term "multimedia type" herein means that the sound source can be outputted from many sound source media.

When the sound source is not the multimedia type one (No), then microcontroller 111 sets an automatic sound control parameter that depends on the sound source (S27). When the sound source is the multimedia type one (Yes) on the other hand, microcontroller 111 further requests reproduction media information via a communications signal or the like (S25). Then, microcontroller 111 receives the reproduction media information from the sound source and sets an automatic sound control parameter that is determined based on the received reproduction media information (S26).

It is noted that an automatic sound control parameter in Embodiment 1 means a control amount that is determined based on vehicle speed signal information, sound source information, and media information and that is used when microcontroller 111 controls sound control section 106 and sound source signal distribution section 105.

After the above-described processing, microcontroller 111 starts an automatic volume control (S28). Then, microcontroller 111 controls sound control section 106 in order to provide an optimal volume depending on an ever-changing value of a vehicle speed signal. Thereafter, a sound output is started (S29) and the processing is completed.

Figure 3:
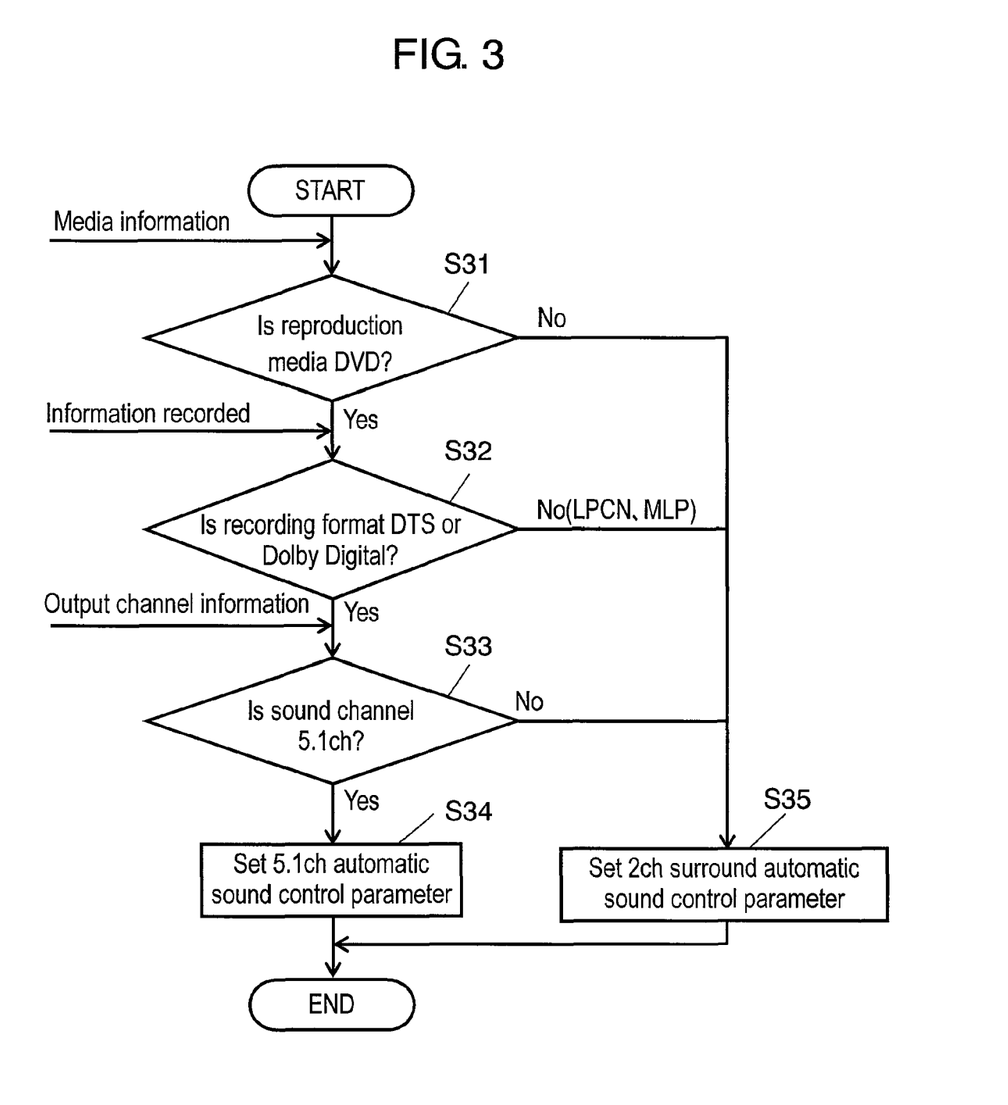
FIG. 3 illustrates an example of the flow of the processing by an acquisition processing method of reproduction media information in Embodiment 1.

FIG. 3 illustrates an example of the flow of the processing by a method of acquiring and processing reproduction media information in the automatic sound control parameter setting (S26) of FIG. 2. Embodiment 1 will describe a case of a DVD medium.

After issuing the request for reproduction media information (S25 of FIG. 2), microcontroller 111 acquires media information to subsequently identify a current reproduction medium (S31). When the medium is a DVD medium (Yes), then microcontroller 111 requests information recorded in the DVD and acquires the information to determine whether the recording format of the information recorded in the DVD is based on a digital theater system (which is shown as "DTS" in the drawing) or a Dolby Digital that is frequently used for a movie DVD video medium or the like (S32). When the recording format of the information is based on DTS or Dolby Digital (Yes), microcontroller 111 requests and acquires the output channel information. Then, microcontroller 111 determines whether a signal from the sound source is a 5.1 ch signal or not (S33). When microcontroller 111 determines that the signal from the sound source is a 5.1 ch signal, then microcontroller 111 sets a 5.1 ch automatic sound control parameter (S34).

When microcontroller 111 determines in S31 that the current reproduction medium is a medium other than DVD media (e.g., CD) (No), when microcontroller 111 determines in S32 that the current reproduction medium is based on linear PCM (which is shown as LPCM in the drawing) or Meridian Lossless packing (which is simply referred to as MLP) that is frequently used for music DVD media (No), or, when microcontroller 111 determines in S33 that the current reproduction medium is a medium other than a 5.1 ch (No), a 2 ch surround automatic sound control parameter is set (S35).

It is noted that, although the above 5.1 ch automatic sound control parameter and 2 ch surround automatic sound control parameter will not be described further, the 5.1 ch automatic sound control parameter for example causes, with an increase of a vehicle speed, the volume amplification degree of a center speaker to be accentuated than the amplification degree of a speaker of another channel, thus allowing the sound from the center speaker to be heard more easily. The 2 ch surround automatic sound control parameter on the other hand causes, with an increase of a vehicle speed, the sound outputs from all channels to be amplified.

As described above, an optimal control can be provided by changing an automatic sound control parameter based on not only a sound source but also a reproduction medium. Specifically, such an in-vehicle sound control system is provided in which in-vehicle communications network 100 is connected to a plurality of sound sources, vehicle speed detection unit 113 for detecting a vehicle running speed, and acoustic reproduction apparatus 120 and acoustic reproduction apparatus 120 is connected to speakers 110 so that a reproduction acoustic signal is controlled in accordance with a vehicle speed signal transmitted from vehicle speed detection unit 113. Acoustic reproduction apparatus 120 includes: sound source signal distribution section 105 for distributing sound source signals inputted from a plurality of sound sources to a plurality of predetermined channels; sound control section 106 for adjusting frequency characteristics and volumes distributed to the respective plurality of channels; and microcontroller 111 for controlling sound source signal distribution section 105 and sound control section 106. This system is structured to switch, in accordance with a plurality of inputted sound sources and media information of the sound sources, a control amount to sound control section 106 determined based on the vehicle speed signal and to input reproduction signals for the respective plurality of channels outputted through sound control section 106 to speakers 110, respectively. By doing this, an optimal automatic sound control can be provided even when, with regards to a single sound source, a reproduction channel is switched to another reproduction channel or when a reproduction medium is switched to another reproduction medium having a sound source signal at a significantly different level.

It is noted that, although Embodiment 1 has described only an example of a reproduction medium in a DVD deck, the present invention also can be applied to a control of other media and sound sources.

When an automatic sound control at an exchange of a medium for example causes a significant difference in a volume level and a sudden change in a volume level in particular, a volume change based on a predetermined time constant can be performed to prevent human ears from feeling sense of incongruity.

Embodiment 2

Figure 4:
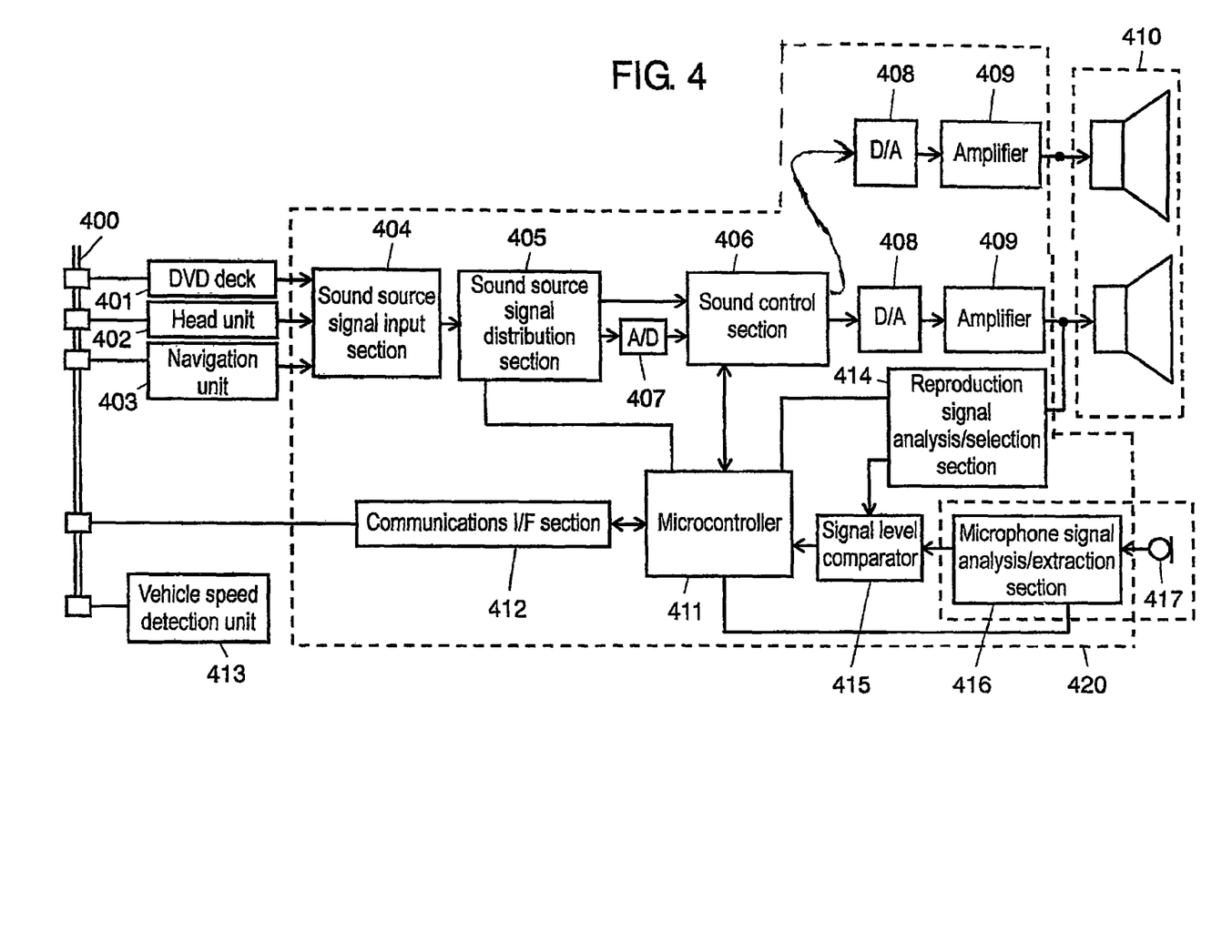
FIG. 4 illustrates an example of a circuit block of an in-vehicle sound control system in Embodiment 2 of the present invention.

FIG. 4 illustrates an example of a circuit block of an in-vehicle sound control system in Embodiment 2 of the present invention.

FIG. 4 has such a structure that includes, in addition to the components of FIG. 1 described in Embodiment 1, reproduction signal analysis/selection section 414; signal level comparator 415; and microphone signal analysis/extraction section 416. Reproduction signal analysis/selection section 414; signal level comparator 415; and microphone signal analysis/extraction section 416 are provided in acoustic reproduction apparatus 420 connected to in-vehicle communications network 400. Acoustic reproduction apparatus 420 is connected to microphone 417. It is noted that, microphone 417 and microphone signal analysis/extraction section 416 are provided as a pair and Embodiment 2 assumes that, although not shown, a plurality of pairs of microphones 417 and microphone signal analysis/extraction sections 416 are provided. It is noted that the same or similar components in FIG. 4 as those of FIG. 1 are denoted by changing "1" in hundreds digits of the reference numbers of the components of FIG. 1 to "4" in hundreds digits of the reference numbers of the components of FIG. 4.

Reproduction signal analysis/selection section 414 is controlled by microcontroller 411 and operates to select and extract a predetermined output channel from a signal outputted from amplifier 409 to input the output channel to signal level comparator 415.

Microphone 417 is inputted with in-vehicle sound that includes reproduced sound outputted from speaker 410. Microphone signal analysis/extraction section 416 is controlled by microcontroller 411 to subject the signal inputted from microphone 417 to a predetermined processing to input the processed signal to signal level comparator 415. Signal level comparator 415 compares the level of the input signal from reproduction signal analysis/selection section 414 with the level of the input signal from microphone signal analysis/extraction section 416 to input to microcontroller 411 a signal showing the difference between the levels.

Next, an operation of an automatic sound control of the in-vehicle sound control system in Embodiment 2 will be described. In Embodiment 2, sound control is performed in accordance with a vehicle speed signal transmitted from vehicle speed detection unit 413 connected to in-vehicle communications network 400 or a noise level assumed based on the output from signal level comparator 415. Specifically, when the output from signal level comparator 415 as an assumed noise level is equal to or higher than a predetermined level and does not continues for a time equal to or higher than a predetermined time, microcontroller 411 uses the vehicle speed signal as an automatic sound control parameter to determine, based on the vehicle speed signal, a control amount to sound control section 406. When the output from signal level comparator 415 as an assumed noise level is not equal to or higher than a predetermined level and continues for a time equal to or higher than a predetermined time on the other hand, the assumed noise level is used as an automatic sound control parameter.

It is noted that the automatic sound control parameter in Embodiment 2 is a control amount that is determined based on vehicle speed signal information or an assumed noise level, sound source information, and media information and that is used when microcontroller 411 controls sound control section 406 and sound source signal distribution section 405.

Next, a specific operation of this in-vehicle sound control system will be described. Embodiment 2 includes the same processing in FIG. 2 and FIG. 3 as those described in Embodiment 1. However, Embodiment 2 is different from Embodiment 1 in the sound control parameter setting processing in FIG. 3 depending on a reproduction medium (S34 and S35) and a processing during the reproduction of a sound source signal. These differences will be described hereinafter.

First, the processing for setting an automatic sound control parameter depending on a reproduction medium not only sets an acoustic parameter to sound control section 406 but also controls reproduction signal analysis/selection section 414 and microphone signal analysis/extraction section 416.

Specifically, the processing for setting a 5.1 ch automatic sound control parameter (S34) allows reproduction signal analysis/selection section 414 to select a channel to be outputted to a center speaker and allows microphone signal analysis/extraction section 416 to extract an input from microphone 417 that receives a high output sound from the center speaker. Alternatively, microphone signal analysis/extraction section 416 also may be inputted with outputs from the respective speaker channels and corresponding inputs to microphones so that signal level comparator 415 can perform a calculation processing by which an output component from the center speaker is significantly weighted. The processing as described above can provide a control that focuses on a noise component given to an output from the center channel.

The processing for setting a 2 ch surround automatic sound control parameter (S35) on the other hand selects output and reproduction channels in a sequential or simultaneous manner to assume, with regards to the respective output and reproduction channels, noise levels based on microphone input signals to average the noise levels for example.

Next, the processing during the reproduction of a sound source signal will be described.

In Embodiment 2, an automatic sound control is performed by assuming a noise level based on output sounds from microphone 417 and a sound source in order to cope with a case as described below. For example, when a silence interval causing a zero output from a sound source is caused between sound source tracks of a reproduction medium, at a temporary stop of the sound source by an operation by a user, or in a switching operation for example, an excessive response by an automatic sound control to a variation in sound inputted to the microphone during the silence interval may cause a case where the automatic sound control causes, after the completion of the silence interval, a variation in sound outputted from the sound source. In this case, a risk is caused where the automatic sound control causes, despite the intention, human ears to feel sense of incongruity in the perceived sound.

Figure 5:
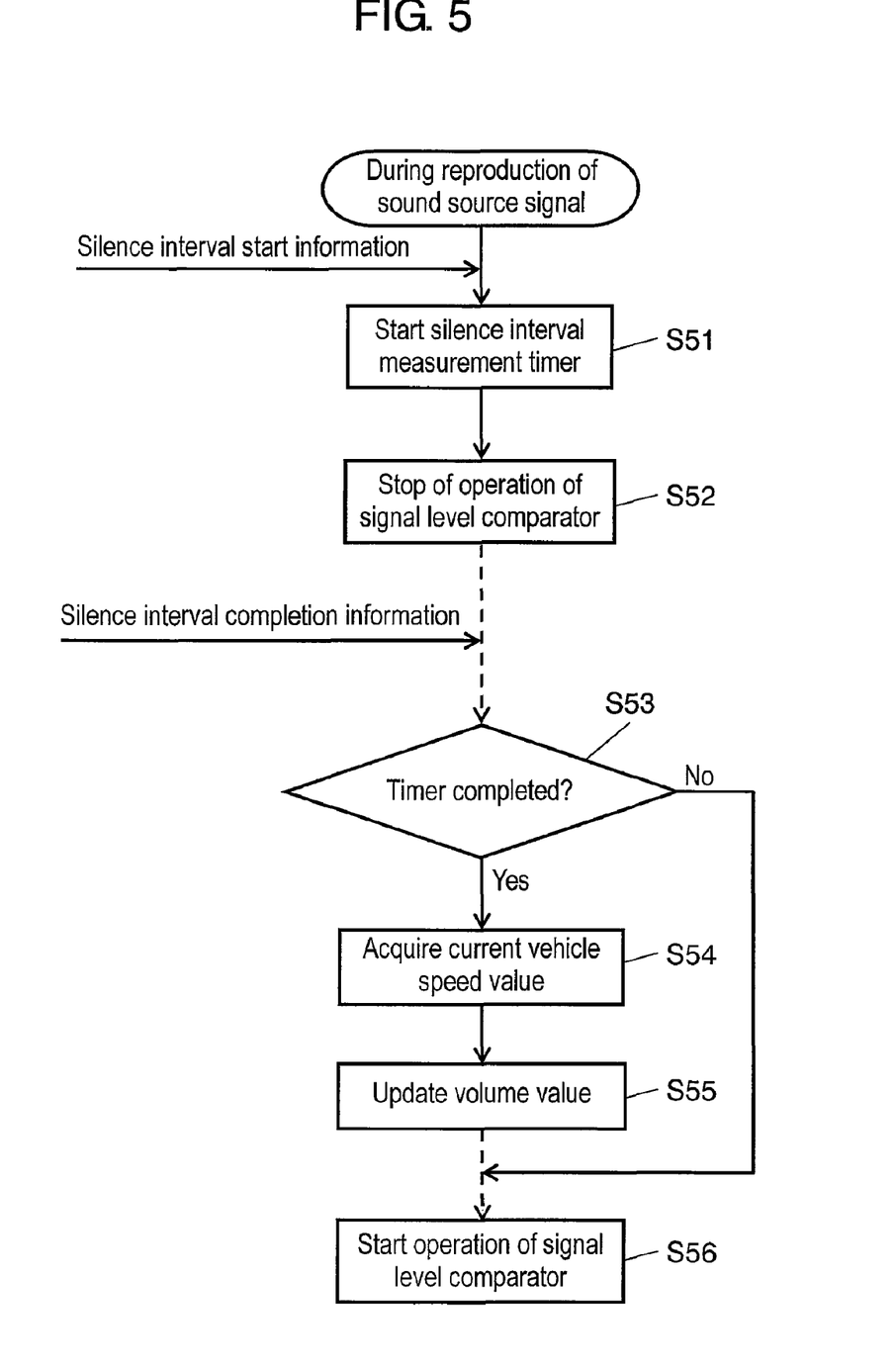
FIG. 5 is a diagram illustrating the flow of the processing performed by a microcontroller when the microcontroller receives silence interval information during the reproduction of a sound source signal by the acoustic reproduction apparatus in Embodiment 2.

In order to solve the above-described problem, Embodiment 2 performs a processing shown in FIG. 5 during the reproduction of a sound source. FIG. 5 is a diagram illustrating the flow of processing performed by a microcontroller when the microcontroller receives silence interval information during the reproduction of a sound source signal by acoustic reproduction apparatus 420 in Embodiment 2.

As shown in FIG. 5, when microcontroller 411 receives silence interval start information during the reproduction of a sound source signal, microcontroller 411 causes a silence interval measurement timer to start (S51). Next, microcontroller 411 causes the operation of signal level comparator 415 to stop (S52). When microcontroller 411 receives silence interval completion information in this status, then microcontroller 411 determines a timer status (S53). When the timer status represents that the timer does not reach a predetermined time yet (No), then microcontroller 411 maintains a current volume value and causes, when a fixed time has passed, signal level comparator 415 to start the operation (S56). When the timer status represents that the timer has reached a predetermined time on the other hand (Yes), microcontroller 411 acquires a current vehicle speed value (S54) to update the current volume value to an automatic volume controlled value to the vehicle speed value (S55). Thereafter, microcontroller 411 similarly allows signal level comparator 415 to start the operation when a fixed time has passed (S56). The system as described above provides an effect according to which, when a silence interval during which an output from a sound source is zero is detected with regards to the sound source, the operation of signal level comparator 415 is stopped so that noise collected by microphone 417 between numbers or during temporary intermission of audio equipment can be prevented from being subjected to an excessive control. Thus, sense of incongruity due to an automatic sound control can be prevented from being felt by human ears.

As described above, the in-vehicle sound control system in Embodiment 2 is structured so that acoustic reproduction apparatus 420 is connected to a plurality of speakers and at least one microphone 417. This system includes: sound source signal distribution section 405 that distributes sound source signals inputted from a plurality of sound sources to a plurality of predetermined channels, respectively; sound control section 406 that adjusts the frequency characteristics and volumes of the sound source signals distributed to the respective plurality of channels; reproduction signal analysis/selection section 414 that extracts, based on a predetermined method, reproduction signals for the respective plurality of channels outputted through sound control section 406; microphone signal analysis/extraction section 416 that extracts, based on a predetermined method, signals inputted from the respective microphones 417; signal level comparator 415 that compares the level of an output signal from reproduction signal analysis/selection section 414 with that from microphone signal analysis/extraction section 416; and microcontroller 411 that controls sound control section 406, sound source signal distribution section 405, reproduction signal analysis/selection section 414, and microphone signal analysis/extraction section 416. This system provides a switching, in accordance with a plurality of inputted sound sources and media information of the sound sources, between a reproduction signal of a channel selected by reproduction signal analysis/selection section 414 and a microphone signal extracted by microphone signal analysis/extraction section 416. This system switches a control amount to sound control section 406 determined based on a vehicle speed signal or a noise level extracted by microphone 417, inputs the respective reproduction signals for a plurality of channels outputted through sound control section 406 to speaker 410 to change a noise signal detection method depending on the type of the medium or a reproduction channel, and can switch, based on the vehicle speed signal or the noise level extracted by microphone 417, a control method to sound control section 406 to an optimal method.

As described above, when the plurality of sound sources include DVD deck media information, a communication procedure is performed that can identify: reproduction media information showing the type of the disc; digital surround information showing information recorded in the medium; and output channel information showing a reproduction channel, as media information. When a sound source of the set reproduction medium is identified as a medium where a dialog sound is outputted from a center channel, reproduction signal analysis/selection section 414 and microphone signal analysis/extraction section 416 can be controlled so as to identify a noise level in the center channel. This provides a sound control suitable to an individual center channel, thus allowing the dialog sound to be caught by human ears easily.

Although Embodiment 2 has not described in detail, when there is a significant difference between a volume control value based on a vehicle speed and a volume control value based on an assumed noise level, the former and the latter may be switched in a time constant manner so as to prevent a sudden difference in volume, thus providing an automatic sound control causing less sense of incongruity to human ears.

INDUSTRIAL APPLICABILITY

The in-vehicle sound control system according to the present invention is connected to various multimedia sound sources and an in-vehicle communications network. This system provides an automatic sound control depending on a measured vehicle speed signal or a level of surrounding noise level. This system is particularly useful to provide a method in which a sound source reproduces a 5.1 ch medium.

The invention claimed is:

1. An in-vehicle sound control system structured so that a plurality of sound sources having respective sound source signals, a vehicle speed detection unit for detecting a vehicle running speed, and an acoustic reproduction apparatus are connected to an in-vehicle communications network, the acoustic reproduction apparatus is connected to a plurality of speakers and at least one microphone, and the system controls reproduction of the sound sources in accordance with a vehicle speed signal transmitted from the vehicle speed detection unit or a noise level detected by the microphone, wherein the acoustic reproduction apparatus includes:

a sound source signal distribution section for distributing at least one of the sound source signals inputted from among the plurality of sound sources to a plurality of channels;

a sound control section for adjusting a frequency characteristic and a volume of the at least one of the sound source signals distributed to the plurality of channels responsive to the vehicle speed signal or the noise level, to produce a reproduction signal for each of the channels;

a reproduction signal selection section for extracting at least one of the reproduction signals from among the plurality of channels outputted through the sound control section based on media information of the at least one of the sound source signals;

a microphone signal extraction section for extracting a signal inputted from the microphone;

a signal level comparator for comparing a level of the at least one of the reproduction signals outputted from the reproduction signal selection section with a level of the signal from the microphone signal extraction section to produce the noise level; and a microcontroller for controlling the sound source signal distribution section, the sound control section, the reproduction signal selection section, and the microphone signal extraction section, wherein the microcontroller selects between the vehicle speed signal and the noise level and determines a control amount for adjusting the frequency characteristic and the volume provided to the sound control section responsive to the selection, the microcontroller selecting the vehicle speed signal when an output from the signal level comparator is equal to or higher than a predetermined level, and the reproduction signals for the respective plurality of channels are provided to the plurality of speakers.

2. The in-vehicle sound control system according to claim 1, wherein when an output from the signal level comparator is equal to or higher than the predetermined level and does not continue for a time equal to or longer than a predetermined time, the microcontroller determines the control amount based on the vehicle speed signal.

3. The in-vehicle sound control system according to claim 1, wherein when the plurality of sound sources include a DVD deck, the in-vehicle sound control system includes a predetermined communication procedure for identifying reproduction media information showing a type of a disc, digital surround information showing information recorded in a medium, and output channel information showing a reproduction channel, as the media information, and when a sound source of a set reproduction medium is identified by the microcontroller as the medium where a dialog sound is outputted from a center channel, the reproduction signal selection section and the microphone signal extraction section are controlled so as to identify a noise level in the center channel.

4. The in-vehicle sound control system according to claim 1, wherein when a silence interval is detected from the sound source, the microcontroller stops an operation of the signal level comparator.

* * * * *